United States Patent [19]

Gussman

[11] Patent Number: 4,684,182
[45] Date of Patent: Aug. 4, 1987

[54] BURN-IN BOARD FOR USE WITH AUTOMATED UNLOADER

[75] Inventor: Robert L. Gussman, Houston, Tex.

[73] Assignee: Reliability Incorporated, Houston, Tex.

[21] Appl. No.: 788,860

[22] Filed: Oct. 17, 1985

Related U.S. Application Data

[60] Division of Ser. No. 709,363, Mar. 8, 1985, Pat. No. 4,584,764, which is a continuation-in-part of Ser. No. 545,747, Oct. 26, 1983, abandoned.

[51] Int. Cl.$^4$ .............................................. H05K 1/00
[52] U.S. Cl. ..................................... 439/68; 29/832; 29/829; 439/159
[58] Field of Search .......................... 29/593, 837–845, 29/825, 829; 339/17 R, 17 B, 45 R, 45 M, 46, 17 CF

[56] References Cited

U.S. PATENT DOCUMENTS

| | | | |
|---|---|---|---|
| 3,377,514 | 4/1968 | Ruehlemann et al. | 361/403 |
| 4,279,072 | 7/1981 | Maurer | 29/764 |
| 4,493,145 | 1/1985 | Honda | 29/840 |
| 4,560,216 | 12/1985 | Egawa | 339/45 M |

Primary Examiner—Carl E. Hall
Attorney, Agent, or Firm—David S. Wise

[57] ABSTRACT

There is disclosed herein an apparatus for unloading IC packages from sockets on a burn-in board according to predetermined performance grades. The IC packages are displaced from the sockets by inserting tools through passageways extending through the burn-in board and socket to contact the underside of the IC package and push the IC package from its socket. Sorting is accomplished by collecting the displaced IC packages of a particular grade and storing them separate from all other IC packages.

3 Claims, 16 Drawing Figures

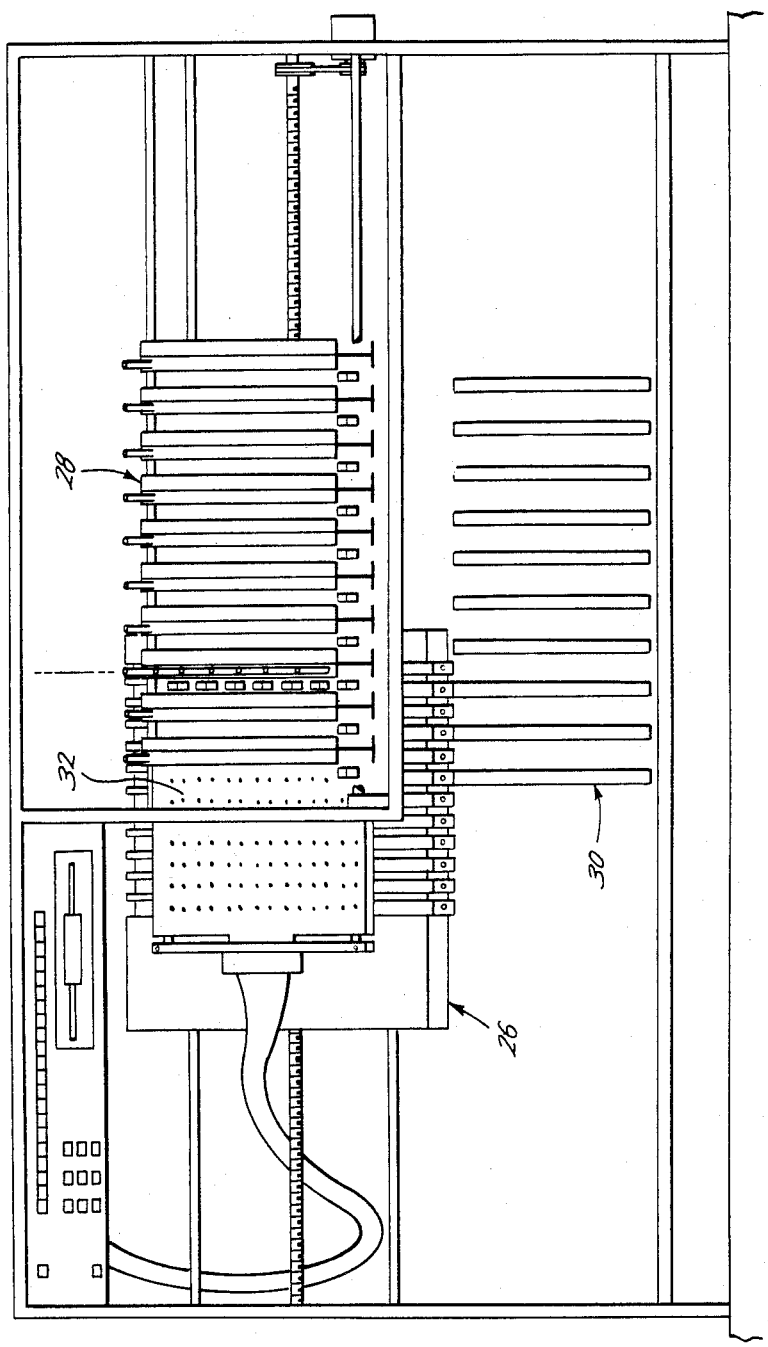
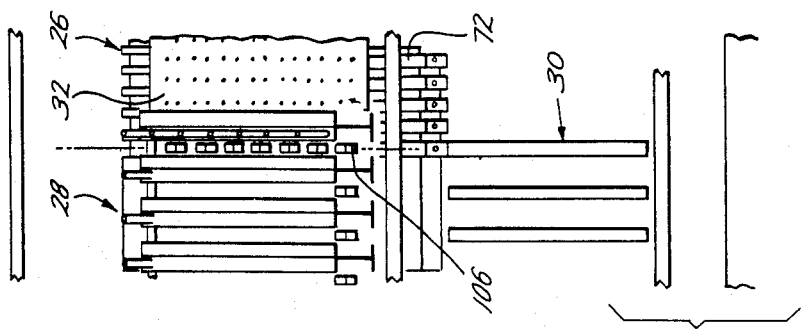

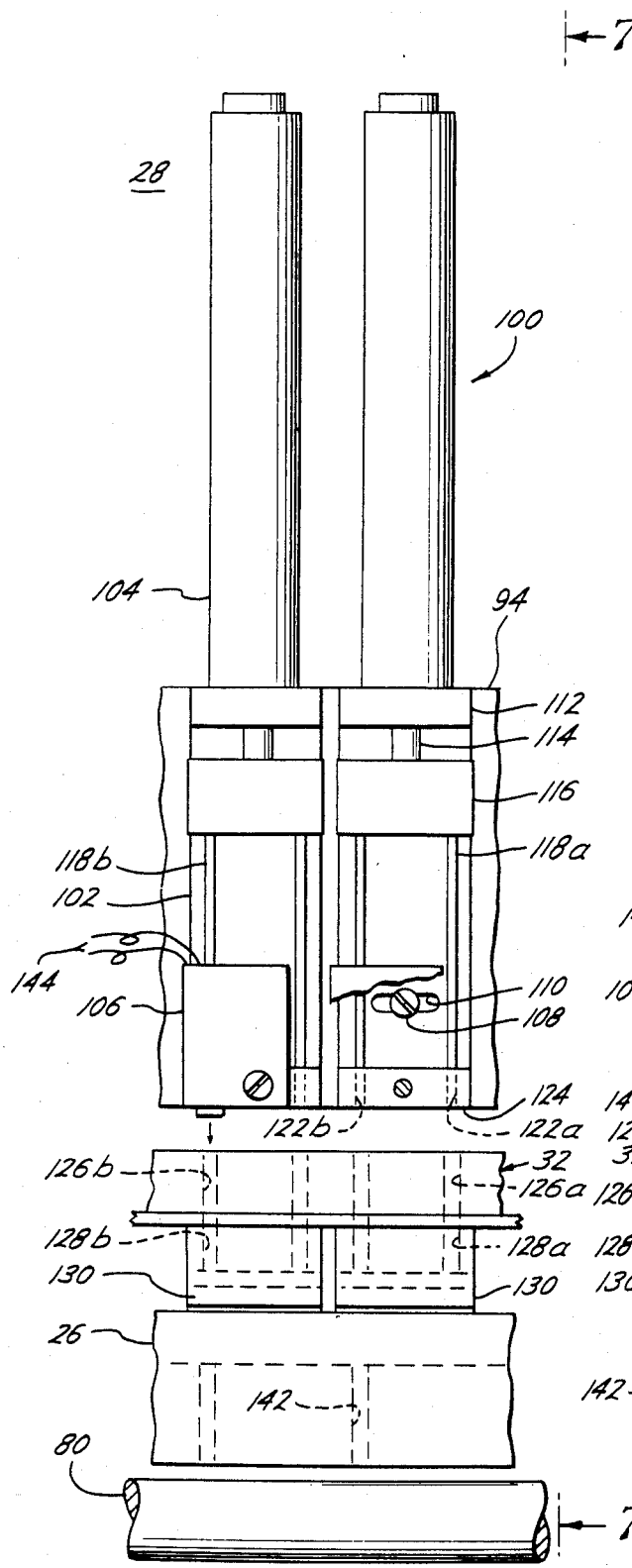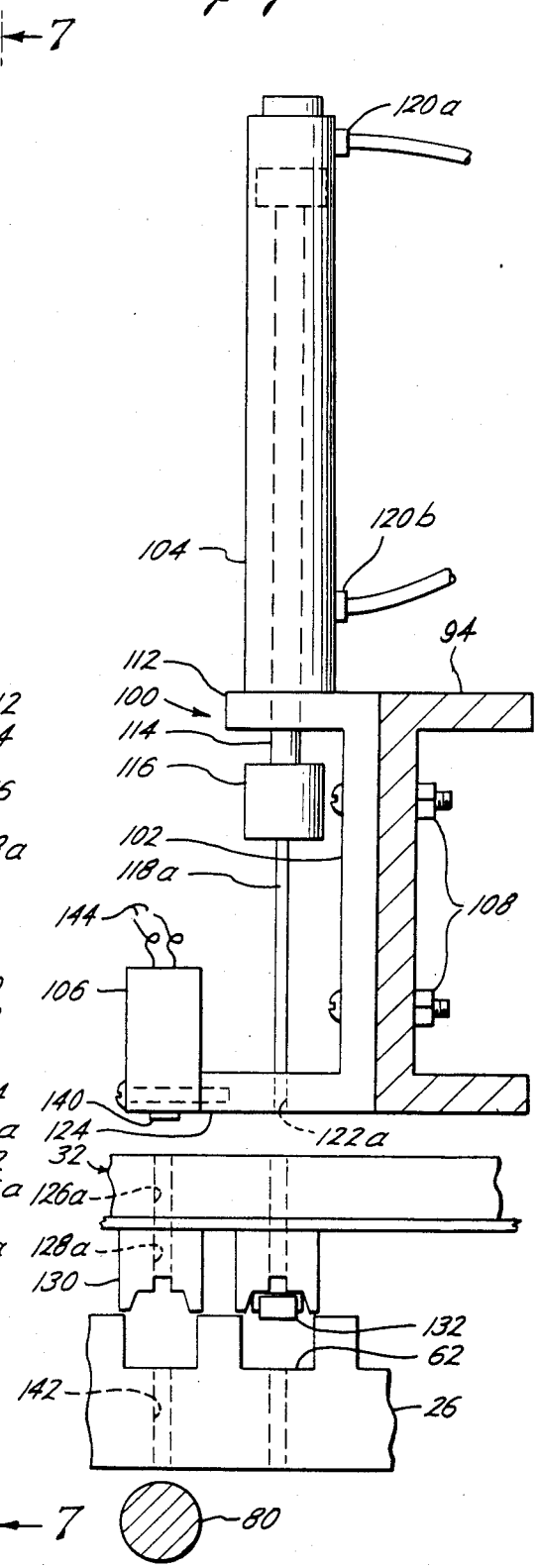

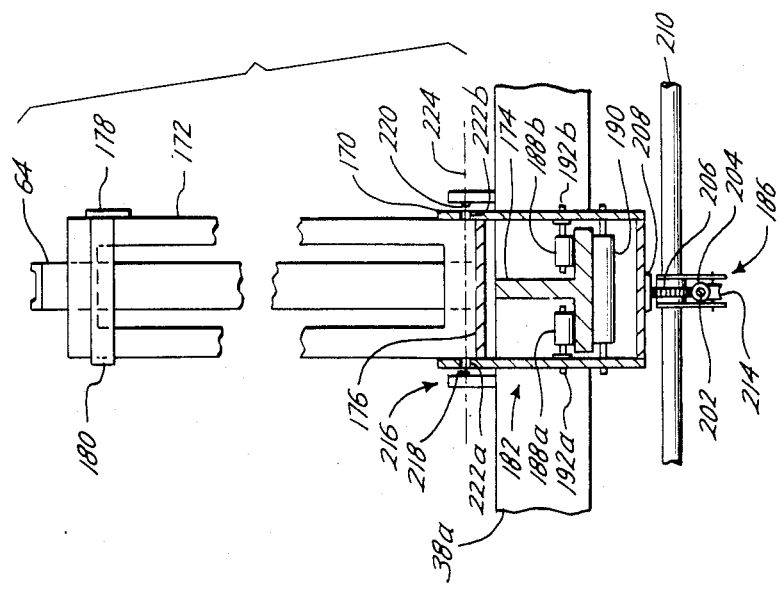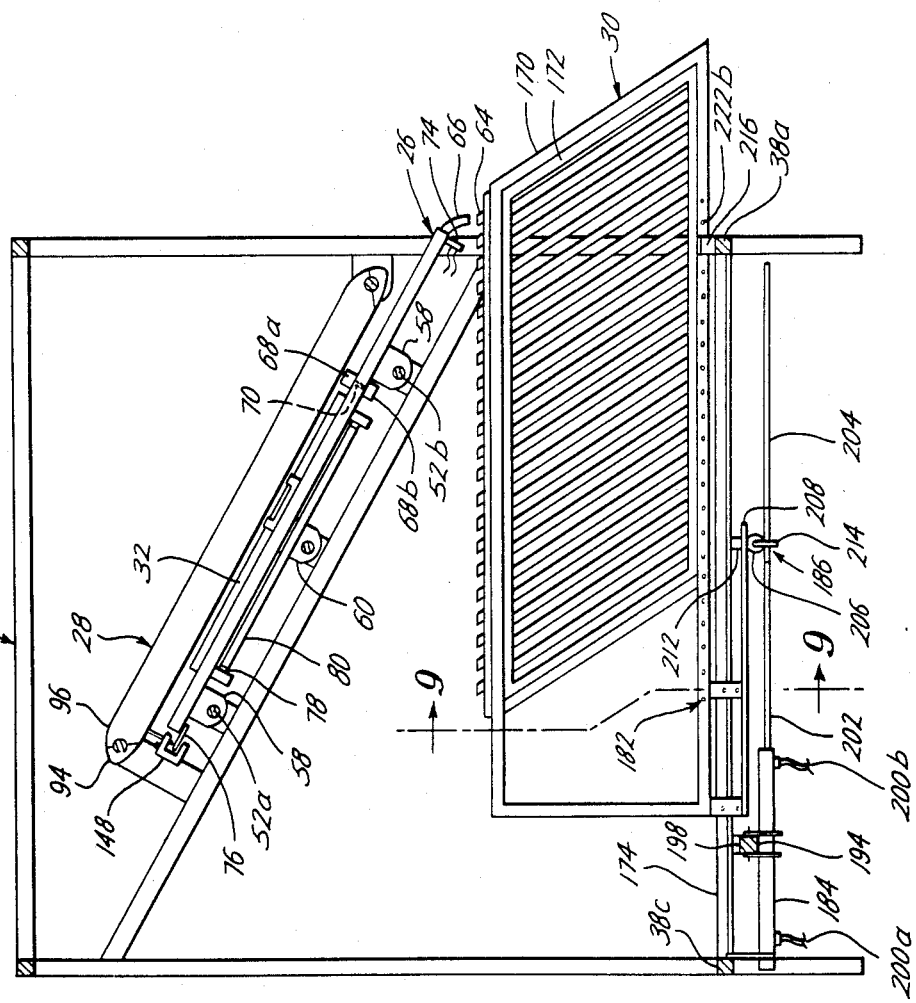

20

BURN-IN BOARD FOR USE WITH AUTOMATED UNLOADER

CROSS-REFERENCE TO RELATED APPLICATIONS

The present application is a division of copending U.S. patent application Ser. No. 709,363, filed Mar. 8, 1985, now U.S. Pat. No. 4,584,764, which is a file wrapper continuation-in-part of patent application Ser. No. 545,747, filed Oct. 26, 1983, now abandoned.

BACKGROUND OF THE INVENTION

The present invention relates generally to the field of automated apparatus for handling electronic circuit components and, more particularly, to automated apparatus for use in the art of burning-in circuit components prior to their distribution and use. Still more particularly, the present invention is directed to the art of automated unloading of electronic integrated circuit (IC) packages from sockets on printed circuit (PC) boards and simultaneous sorting of the packages according to predetermined performance grades.

According to present practices, IC packages are mass-produced and installed in electronic circuits within highly sophisticated, complex and costly equipment. As with many mass-produced products, IC packages are prone to failure, in many cases within the first one thousand hours of operation. The complexity of the equipment within which such packages are installed makes post-installation failures highly undesirable. For example, when equipment reaches the final inspection stage of production, before failures are detected, the high level skills required for testing and repair add a significant cost to production expenses. Even more significantly, when the product has been installed in the field and a service technician must make warranty repairs, the costs thereby incurred can have a significant effect on profitability. As a result, manufacturers of electronic equipment are demanding ever greater quality and dependability in commercial grade IC packages.

Quality and dependability are enhanced substantially by detection of those IC packages likely to fail in the first few hours of operation, prior to installation of the packages in electronic equipment. One of the methods for detecting flawed IC packages is referred to as "burn-in". According to burn-in techniques, IC packages are stressed within their physical and electrical limits prior to installation, whereby those packages likely to become early failures in completed equipment can be discovered.

Burn-in involves placing a large number of IC packages on one or more PC boards ("burn-in boards"); placing the burn-in boards with the packages mounted thereon in a chamber whose environment, particularly temperature, is controllable; applying direct current (dc) biases to each package on each board in such a manner as to forward and reverse bias as many of the package's junctions as possible, and/or actively clocking each package to its maximum rated conditions, such application of dc biases and clock signals being accomplished substantially simultaneously to each package; removing the burn-in boards from the chamber after the IC packages have been subjected to the environmental condition of the chamber and the biases and clock signals for a designated period of time; and removing the IC packages from the burn-in boards.

A second method for improving quality control of the IC package subsequent to burn-in is to verify that the IC package functions according to its minimum rated specifications. Typically, each IC package is tested across a broad range of parameters and graded in quality according to its performance. Thereafter, the IC packages are sorted into groups according to the predetermined performance grades.

The burn-in and testing processes, however, although successful in reducing the expense of troubleshooting failed electronic equipment, are not themselves without expense. Substantial capital expenditures are necessary to purchase or construct burn-in chambers, burn-in boards, and test equipment. Personnel must be employed and trained to operate the equipment and to monitor the time-consuming processes. In some cases entire businesses have been built around performance of the burn-in and testing processes. Use of the processes and, consequently, the success of a business that provides such services, is dependent upon the cost effectiveness of burning-in and testing the IC packages vis-a-vis not burning-in or testing the IC packages but instead replacing those IC packages that fail after installation and use in the field.

One means for improving the cost effectiveness of the burn-in and testing processes is a reduction in labor costs. Accordingly, efforts have been made to automate the foregoing processes as much as possible. Several companies manufacture machines for loading IC packages into sockets on a burn-in board. See, for example, copending U.S. patent application Ser. No. 442,518, filed on Nov. 18, 1982, assigned to the assignee of the present application. Machines for unloading IC packages from the sockets on a burn-in board also have been constructed.

The assignee of the present application manufactures a Burn-In Board Device Unloader Model 1217, described generally in an advertising circular of the same title. The burn-in board to be unloaded is positioned on an inclined base with each column of IC packages aligned with a tapered lifting rod. Each lifting rod comprises a ramp-like base portion of gradually increasing depth and a carriage tube at the upper portion thereof. The lifting rod is inserted into a longitudinal channel formed in a socket providing access to the underside of an IC package. As the lifting rod moves along the longitudinal channel, on the underside of the column of IC packages, the IC packages are lifted sequentially from the sockets and fed by gravity along the carrier tube to plastic storage tubes. Several lifting rods are moved simultaneously by manual motion along the columns of sockets and IC packages, whereby an entire board may be unloaded in a single sweep of the arm.

Applicant is aware that IDEA, Inc. manufactures an automated burn-in board unloader. It is believed that the IDEA machine removes IC packages a row at a time from sockets by inserting a hook means between the socket and the IC package and moving the hook means perpendicularly away from the burn-in board so as to pull the IC package from the socket. The IC packages then are fed by gravity from the hook means to plastic storage tubes.

A wide variety of apparatus is available for performing the aforedescribed testing and sorting of IC packages after the burn-in process is completed (assuming that the burn-in process is to be performed). U.S. Pat. Nos. 3,587,852; 3,664,499; 3,727,757; and 3,896,935 show automated apparatus for testing and sorting IC packages. Typically, IC packages are fed serially from plastic storage tubes to a conveyor mechanism, whereby the IC packages are communicated sequentially to testing apparatus. Once the testing is completed, the IC packages are deposited in one of several containers according to the test results.

Thus, automated apparatus is available for loading IC packages onto burn-in boards, for burning in the IC packages, for unloading the burn-in boards and for testing and sorting the burned-in IC packages. In an effort to improve the efficiency of the foregoing quality assurance program, apparatus has been designed and constructed for burning in and simultaneously testing the IC packages, obviating the need for a separate test apparatus. If, however, the IC packages must be sorted into a plurality of grades as well, the improved efficiency derived from combining the burn-in and testing processes is lost as the IC packages are manually sorted according to the predetermined grades.

Hence, it should be apparent that maximum efficiency in the quality assurance program could be achieved through use of an automated apparatus capable of unloading a burn-in board and sorting the IC packages according to predetermined performance grades.

SUMMARY OF THE INVENTION

Accordingly, there is disclosed herein an automated unloader/sorter apparatus which unloads IC packages from burn-in boards in a rapid and efficient manner. Simultaneous sorting of the IC packages according to predetermined performance grades is accomplished by successively unloading, a column at a time, only those IC packages having the same performance grade.

Burn-in boards for the unloader/sorter apparatus include passageways, preferably two per socket, extending through the burn-in board and the sockets, thereby providing access to the underside of the IC package in each socket. The unloader/sorter apparatus includes a table for supporting the burn-in board, means for pushing the IC packages from the sockets, and means for collecting the displaced IC packages.

The burn-in board table is inclined to facilitate gravity feeding of IC packages from the burn-in board to the collecting means and includes means for engaging the burn-in board and a plurality of grooves along the inclined dimension of the table. The burn-in board is mounted face down on the table with each column of sockets thereon being aligned within a groove in the table.

The pushing means preferably comprises a plurality of fluid-powered cylinders having extensible means connected thereto for insertion through the passageways in the burn-in board and sockets. The cylinders are arranged in a plurality of columns, called "unloader channels," each of which is assigned a particular performance grade of IC package. The unloader channels are positioned so that the burn-in board can pass just therebeneath, whereby sockets are aligned by columns with the unloader channels.

The unloader/sorter apparatus further includes a means by which the burn-in board table is moved relative to the unloader channels. Thus, each column of sockets on the burn-in board passes sequentially beneath each unloader channel. Each unloader channel selectively pushes from the sockets therebeneath those IC packages having the performance grade assigned to the particular unloader channel. All IC packages are thereby unloaded from sockets on the burn-in board.

Once displaced from a socket, an IC package drops into the corresponding groove within the table and slides to the collecting means. The collecting means comprises a plurality of plastic IC package storage tubes arranged in a plurality of storage racks, which are removably situated within storage frames. The storage racks maintain a plurality of storage tubes in columnar alignment. Storage racks can be removed and replaced from storage frames with relative ease. There is one storage frame aligned beneath each unloader channel. IC packages are delivered from the burn-in board table into storage tubes waiting at the edge thereof. As a storage tube reaches its capacity, the corresponding storage frame is stepped forward to position an empty storage tube in its place.

The unloader/sorter apparatus also includes apparatus for verifying the proper operation of the unloading process. Means is included for counting each IC package as it slides down a groove and comparing the number counted to the number of IC packages which were to be unloaded. Means is also included within each unloader channel for verifying the presence or absence of an IC package within a socket. Thus, integrity of the unloading and sorting process is subject to constant scrutiny.

In accordance with an improved embodiment of the invention, the pushing means of the automated unloader/sorter apparatus comprises a single unloader channel for displacing all IC packages from the burn-in board. All of the IC packages of a single performance grade are displaced one at a time from the sockets in one column of the burn-in board and are collected on a shuttle plate. The shuttle plate, not present in the embodiment of the invention described previously, comprises a plate means slidably disposed at the lower end of the burn-in board table for communicating IC packages from the burn-in board table to the IC package storage tubes corresponding to the particular grade of IC packages. Following the foregoing procedure, all IC packages are unloaded from one column of sockets on the burn-in board before proceeding to the next column.

In the improved embodiment of the invention, the collecting means comprises a single tube rack for angularly supporting a plurality of storage tubes in a row across the front of the apparatus. Each storage tube is directly accessible to the mobile shuttle plate for receiving IC packages of a predetermined performance grade. Means are included for monitoring the number of IC packages loaded into a particular storage tube and for alerting the operator to replace a storage tube when it is full.

These and various other characteristics and advantages of the present invention will become readily apparent to those skilled in the art upon reading the following detailed description.

BRIEF DESCRIPTION OF THE DRAWINGS

For a detailed description of the preferred embodiment of the invention, reference will now be made to the accompanying drawings, wherein:

FIG. 4 depicts, in cut-away elevation, the apparatus as shown in FIG. 3 with the burn-in board table repositioned so that the first column of IC sockets is aligned with a channel of optical sensors;

FIG. 5 depicts the apparatus as shown in FIG. 4 with the burn-in board table repositioned at a point near the end of the unloading and sorting process;

FIG. 6 depicts an unloader channel in side elevation;

FIG. 7 depicts an unloader channel in cross section along a line 7—7 shown in FIG. 6;

FIG. 8 depicts the apparatus of FIG. 1 in cross section along a line 8—8 shown in FIG. 3;

FIG. 9 depicts a portion of the apparatus in cross section along a line 9—9 shown in FIG. 8;

DESCRIPTION OF THE PREFERRED EMBODIMENT

The demand for reliable quality control in the manufacture of integrated circuit (IC) packages has resulted in the development of a variety of automated apparatus for loading IC packages onto burn-in boards, for unloading the burn-in boards, and for testing and sorting the IC packages into one or more grades according to performance thereof. In an effort to improve the efficiency of the overall quality control process, apparatus has been developed for burning in a plurality of IC packages installed on a burn-in board and simultaneously testing the IC packages. As they are tested, the IC packages are graded according to their performance and the data so generated is stored for later use in sorting the IC packages according to grades.

The present invention introduces a method and apparatus for unloading a burn-in board at a relatively rapid pace and for simultaneously sorting the IC packages into a plurality of grades. Hence, use of the present invention in cooperation with the aforementioned single burn-in/test apparatus obviates the need for a separate tester and sorter, which is often quite complex and always quite expensive. Aside from the savings in capital expense and maintenance cost, elimination of the need for a separate tester/sorter apparatus also speeds up the quality control process quite significantly.

SYSTEM OVERVIEW

Figure 1:
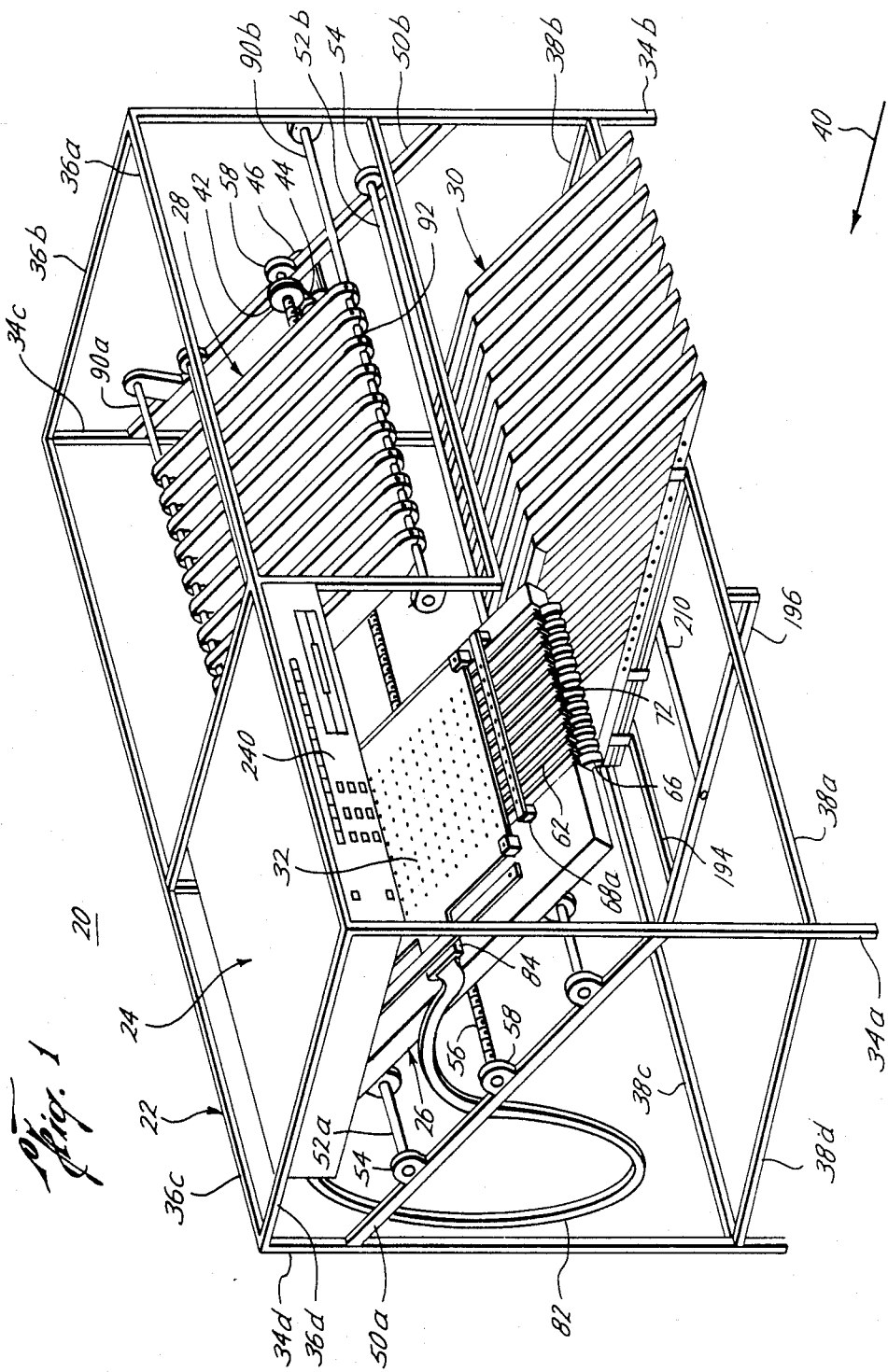
FIG. 1 depicts, in perspective, an automated burn-in board unloader and IC package sorter arranged in accordance with the principles of the invention, with cosmetic portions thereof removed to disclose the functional apparatus.

Referring generally to FIG. 1, the unloader/sorter apparatus 20 described herein includes a welded metal frame 22, a control unit 24 in an upper corner of the frame 22, a burn-in board table 26 slidably supported on a diagonal within the frame 22, a plurality of unloader channels 28 arranged to receive therebeneath the burn-in board table 26, and a plurality of storage frames 30 slidably situated at the bottom of the frame 22 under the unloader channels 28.

A burn-in board 32 having a plurality of sockets mounted thereon for receiving IC packages is secured face down to the burn-in board table 26. Each burn-in board 32 is specially designed for use with the unloader/sorter apparatus 20, having for each socket a pair of passageways which extend from the underside of the burn-in board 32 through the burn-in board 32 and the socket, providing access to the underside of the IC package which is installed in the socket. With the burn-in board 32 in place, the burn-in board table 26 slides beneath the unloader channels 28, aligning a first column of holes within the burn-in board 32 with a first unloader channel 28. Each unloader channel 28 includes extensible means for insertion through the passageways in the board 32 and sockets to push IC packages from the sockets on the burn-in board 32. In addition, each unloader channel is associated with a particular performance grade of IC package. Information regarding the performance grade of each IC package on the burn-in board 32 is collected and stored during the burn-in and testing operations and is then communicated to the control unit 24, whereby IC packages may be selectively punched from the burn-in board by the appropriate unloader channels 28.

Each column on the burn-in board 32 is progressively moved beneath each unloader channel 28. As IC packages are pushed from the sockets, the IC packages drop into grooves within the burn-in board table 26 and slide down the table 26 into plastic storage tubes within the storage frames 30. Like the unloader channels 28, each individual storage frame 30 is associated with a particular performance grade of IC package, enabling the storage of each grade in separate storage tubes and completing the sorting process in a fast and efficient manner. Means are also included for verifying prior to storage that only the proper IC packages have been displaced from their sockets by each unloader channel 28.

IC packages, as are referred to herein, comprise a body portion or cartridge, which is generally a parallelepiped having from four to sixty-four electrical leads of a generally L-shaped cross section extending out and down from the opposing sides of the cartridge. The overall width of the IC package may be, for example, 0.3, 0.4, or 0.6 inch. The sockets mounted on the burn-in board 32 include socket contacts defining slots for receiving electrical leads of the IC packages. The IC package also may be a leadless component sometimes referred to as a "chip," which is of a square or rectangular geometry and a relatively thin cross section, giving the chip an overall wafer-shaped appearance. In the usual construction, the chips have conductive coatings applied to select edges, or in some cases at select areas on the major chip surfaces, requiring proper orientation of the chip before mounting onto a circuit substrate.

DETAILED DESCRIPTION OF THE UNLOADER/SORTER APPARATUS

More particularly, the unloader/sorter apparatus 20 is shown in perspective in FIG. 1 supported within the welded metal frame 22. Sheet metal, or some other appropriate material (not shown) may be used to cover the frame 22 and protect the apparatus contained therein. The generally box-shaped frame 22 includes four upright members 34a,b,c,d with upper horizontal member 36a-d and lower horizontal members 38a-d connected therebetween.

The control unit 24 includes a microprocessor and associated electronic apparatus enclosed within a housing positioned at the upper left end of the frame 22, facing the front of the apparatus 20 as shown by the arrow at 40. The control unit 24 is described in greater detail in the subsection entitled, "The Control Unit," infra.

A pair of carriage support members 50a,b extend diagonally downward at an angle of approximately forty-five degrees with respect to the horizontal from the upper portion of the rearward upright members 34d,c to the lower portion of the front upright members 34a,b, respectively. A pair of cylindrical carriage bars 52a,b extend widthwise between the carriage support members 50a,b and are secured thereto by bar housings 54. In addition, a positioning screw 56 is rotatably supported by means of screw housings 58 between the support members 50a,b. The carriage bars 52a,b provide a track for guidance and support of the burn-in board table 26. The positioning screw 56 is connected by means of a pulley 42 and belt 44 to an electric motor 46. Energizing the motor 46 causes rotation of the positioning screw 56, moving the burn-in board table 26 along the carriage bars 52a,b.

THE BURN-IN BOARD TABLE

Referring now to FIGS. 1 and 8, the burn-in board table 26 comprises a generally rectangular slab of what is preferably an electrically nonconductive material, such as wood or a form of plastic. The lower face of the table 26 includes a plurality of table support mechanisms 58 affixed thereto for slidably engaging the carriage bars 52a,b and for supporting the table 26 in an angular plane sloping downward toward the front 50 of the apparatus 20. The lower face of the table 26 also includes a table positioning mechanism 60 for threadedly engaging the positioning screw 56. The positioning mechanism 60 converts angular motion of the positioning screw 56 to linear motion of the burn-in board table 26 along the carriage bars 52a,b.

The burn-in board table 26 includes a plurality of grooves 62, a pair of sensor racks 68a,b, a gate 72 within each groove 62, and a programming bar 76. The grooves 62 extend linearly in the upper face of the burn-in board table 26 from the rearward edge to the front edge thereof. The grooves 62 are sized widthwise according to the spacing between columns of sockets on the burn-in board 32 and according to the width of the IC packages within those sockets. Each groove 62 corresponds to a single column of IC packages/sockets on the burn-in board 32. The grooves 62 provide a path by which IC packages which have been punched from the burn-in board 32 are gravity-fed to storage tubes 64 within the storage frames 30. A plurality of boreholes 142, one for each socket 130, extend from the base of the groove 62 to the underside of the table 26. A plurality of curved mouthpieces 66 form a connecting path between the grooves 62 and the storage tubes 64, as depicted particularly in FIG. 8.

Optical sensor racks 68a,b extend widthwise across the grooved portion of the table 26 immediately in front of the burn-in board 32, providing means for counting the IC packages displaced from the sockets as the IC packages move down the grooves 62 toward the storage tubes 64. The lower sensor rack 68b includes a plurality of light sources, for example, one for each groove 62, and the upper sensor rack 68a includes a plurality of corresponding photoelectric sensors. A plurality of small diameter boreholes 70 through the table 26 provide means for communicating light between the light sources and the photoelectric sensors. Thus, passage of an IC package along a groove 62 in the table 32 is marked by the blocking and reopening of the optical path between the sensor racks 68a,b.

Referring still to FIGS. 1 and 8, the forwardmost end of each groove 62 in the table 26 includes the gate 72, comprising the shaft of a pneumatic cylinder 74 extending generally upwardly from the underside of the table 26. The cylinder shafts are normally extended so as to prevent IC packages deposited in the grooves 62 from entering the storage tubes 64 until verification procedures are completed, as described infra in the subsection entitled, "The Unloader Channels." Once proper functioning of the unloading process has been verified, the gates 72 are retracted, allowing the IC packages to slide into the storage tubes 64. In the event that the verification procedures identify an error, one of two things may occur; the unloader/sorter apparatus may cease operation until the problem is resolved or the process may continue after the IC packages unloaded during the faulty process have been delivered to a default storage tube for eventual discard or recycling. In any case, the particular IC packages are not delivered to the corresponding storage tube 64 when an error is identified.

Figure 2:
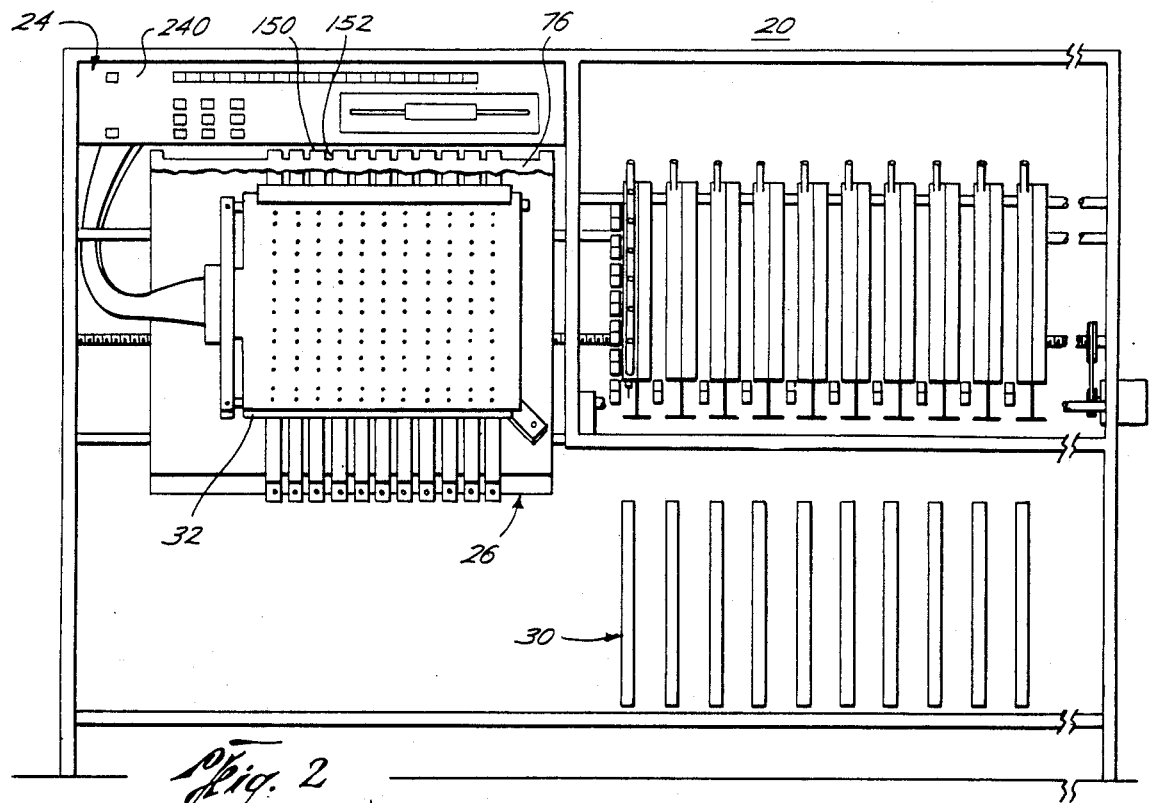
FIG. 2 depicts the apparatus of FIG. 1 in front elevation with the burn-in board table in loading position.

Referring briefly to FIG. 2, there is shown therein a front elevation of the unloader/sorter apparatus 20 with the rearward (upper) portion of the burn-in board table cut away to reveal the programming bar 76. As described in greater detail in the subsection entitled, "The Unloader Channels," infra, the programming bar 76 is used in cooperation with at least one light source and photoelectric detector to position the burn-in board table 26 accurately with respect to the unloader channels. As shown in FIG. 8, the programming bar 76 may be attached to the rearward edge of the lower face of the burn-in board table 26 so as to move between the light source and detector as the table 26 moves along beneath the unloader channels 28.

Referring again to FIGS. 1 and 8, the table 26 further includes on the lower face thereof beneath each groove 62 a light source, such as a tubular fluorescent lamp fixture 78 and lamp 80. The light source is used in cooperation with apparatus within the unloader channels 28, as described infra in the next subsection, for verifying proper functioning of the unloading process.

Finally, an electronic cable 82 connects the control unit 24 through a slot connector 84 to the burn-in board 32 on the table 26, enabling the control unit 24 to identify the particular burn-in board 32 which is ready to be unloaded. In addition, the cable 82 may include control and electrical service wiring for the lamp fixtures 80, the sensor racks 68a,b, and the pneumatic gate cylinders 74, as necessary.

The Unloader Channels

The unloader channels 28 are shown generally in FIG. 1 to be slidably affixed between a pair of transit bars 90a,b. The transit bars 90a,b are situated in a plane which is generally parallel to and above the plane defined by the carriage bars 52a,b, whereby the burn-in board table 26 can slide beneath the unloader channels 28 and remain at a relatively constant distance therefrom. The unloader channels 28 include a set screw means 92 for slidably adjusting the position of and spacing between the unloader channels 28 along the transit bars 90a,b. Adjustment of the unloader channels 28 is necessary to enable the unloader/sorter apparatus 20 to be adaptable to different sizes of IC packages on different burn-in boards 32.

In FIG. 8, the unloader channels 28 are shown in side elevation. Each unloader channel 28 includes a base structure 94 surrounded by a removable protective cover 96. The burn-in board 32, mounted on the burn-in board table 26, slides just beneath the unloader channels 28.

FIG. 6 depicts a portion of an unloader channel 28 in side elevation with the protective cover 96 removed to reveal the apparatus contained therein. FIG. 7 shows the unloader channel of FIG. 6 in front elevation along a line 7—7 shown in FIG. 6. Referring now to FIGS. 6 and 7, the base structure 94 comprises a generally C-shaped length of angle iron. The base structure 94 supports a plurality of unloader units 100, there being one unloader unit 100 for each socket in a column on the burn-in board 32.

A single unloader unit 100 includes a unit support member 102, a pneumatic cylinder 104, and a photoelectric detector 106. The unit support member 102 comprises a short length of C-shaped channel adjustably secured to the base structure 94 by means of a pair of bolts 108 through slots 110 in the unit support member 102. The pneumatic cylinder 104 is threadedly engaged within the upper, generally horizontal extension 112 of the unit support member 102 so as to extend generally perpendicularly therefrom. A cylinder shaft 114 extends through the unit support extension 112 to a threaded engagement at the lower end thereof within a punch extension block 116. Dual punch extensions 118a,b which may be, for example, 0.060 inch in diameter, extend downwardly from threaded engagement within the lower end of the block 116. The lower ends of the punch extensions 118a,b extend within corresponding bores 122a,b through a lower horizontal extension 124 of the unit support member 102.

The pneumatic cylinder 104 is powered by fluid received and vented through a pair of ports 120a,b. Pressurized fluid provided to upper port 120a, for example, causes the extension of the shaft 114 and downward travel of the dual punch extensions 118a,b. The punch extensions 118a,b travel downward to the burn-in board 32 and, when the burn-in board table 26 is positioned properly, through 0.070 inch diameter boreholes 126a,b, through the burn-in board 32, and through 0.080 inch diameter coaxial boreholes 128a,b in a socket 130 to reach the base of an IC package 132. Further extension of the punch extensions 118a,b pushes the IC package 132 out of the socket 130, whereupon the IC package 132 drops into the base of the corresponding groove 62 in the burn-in board table 26 and slides toward a storage tube (not shown), described previously. Pressurized fluid delivered through the lower port 120b of the pneumatic cylinder 104 causes retraction of the shaft 114 and punch extensions 118a,b.

The lower horizontal extension 124 of the unit support member 102 supports on the end face thereof the photoelectric detector 106. The detector 106 includes on the lower face thereof a light-sensitive element 140 arranged to sense light emitted by the fluorescent lamp 80 mounted along the underside of the table 32. The plurality of boreholes 142, one for each socket 130, extending from the base of the groove 62 to the underside of the table 26 are generally coaxial with the boreholes 126b, 128b through the burn-in board 32 and socket 130. When the table 26 is properly aligned beneath the unloader channel 28, the fluorescent lamp 80 will emit light through the aligned boreholes 126b, 128b of the table 26 and the empty socket 130, respectively. Thus, the photoelectric detector 106 provides an indication to the control unit as to whether an IC package 132 is present within the corresponding socket 130. The sensing or not of light by the detector 106 indicates the absence or presence, respectively, of the IC package 132. The detector 106 acts as an electric switch, providing a signal through electric wires 144 to the control unit.

Referring briefly to FIG. 8, some of the individual unloader channels 28 include a sensor means 148 arranged for facilitating proper positioning of the burn-in board table 26 relative to the unloader channels 28. As described above, the table 26 includes the programming bar 76 along the lower rearward edge thereof. Referring now to FIG. 2, the programming bar is shown to include a plurality of teeth 150. Spacing between the teeth 150 is arranged so that an edge of each tooth 150, for example a leading edge 152, may be aligned, by properly positioning the burn-in board 32 on the table 26, with a column of sockets on the burn-in board 32.

Referring now to FIGS. 2 and 8, the sensor means 148, which may be, for example, a CLI 355 optoelectric device manufactured by Clairex, is arranged such that the programming bar 76 passes between two sensors on the sensor means 148, which detects the presence of the leading edge 152 of the tooth 150 on the programming bar 76. When the sensor means 148 detects the leading edge 152, it provides a signal to the control unit 24 that the burn-in board 26 is in position beneath the unloader channels. The sensor means 148 is mounted to the underside of selected unloader channels 28. It is not necessary to include a sensor means 148 with each unloader channel. The table position monitoring system described herein will operate properly so long as the teeth 150 of the programming bar 76 remain within proximity of a single sensor means 148. Because the total width of the unloader channel portion of the apparatus 20 may exceed the width of a burn-in board 32, however, it may be necessary to use more than one sensor means 148. Accordingly, a minimum number of the sensor means 148 should be spaced among selected individual unloader channels 28 so as to insure that the teeth 150 will always be within proximity of at least one sensor means 148.

Figure 10:
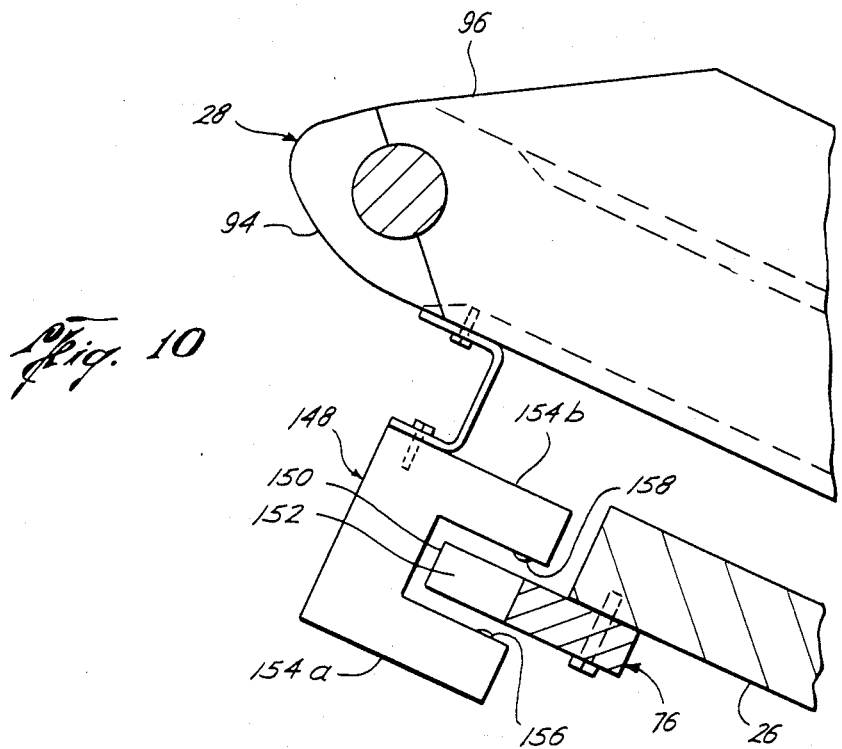
FIG. 10 depicts elevation of a programming bar and sensor means shown in FIG. 8.

FIG. 10 shows an elevation of the sensor means 148 secured to the lower, rearward end of the base structure 94 of an unloader channel 28. The sensor means 148 includes two forwardly extending portions 154a,b generally defining a U-shape. A first extension 154a houses therewithin a light-emitting diode for generating a beam of light at 156 toward a photosensitive transistor at 158 housed within the second extension 154b of the sensor means 148. FIG. 10 shows the diode and transistor of sensor means 148 to be in photoelectric communication, the sensor means 148 being aligned with the space between a pair of teeth 150. As the leading edge 152 of the tooth 150 advances so as to block photoelectric communication between the diode and transistor, the sensor means 148 generates an electrical signal to the control unit (24 in FIG. 1) indicating that the table (26 in FIG. 1) is properly aligned under the unloader channels 28. Thus, the presence or absence of a beam of light at 158 to activate or deactivate, respectively, the photosensitive transistor may be utilized as an electronic switch for communicating to the control unit the position of the burn-in board table 26.

Thus, the unloader channel portion of the apparatus includes means for removing IC packages from sockets on the burn-in board and means for verifying the presence or absence of an IC package within any socket. In addition, selected unloader channels 28 include the sensor means 148, which functions cooperatively with the programming bar 76 to provide an indication to the control unit of burn-in board table position.

The Storage Frames

The storage frame portion of the unloader/sorter apparatus facilitates automatic loading of the sorted IC packages into plastic storage tubes. There is one storage frame for each unloader channel of the unloader/sorter apparatus. Referring now to FIGS. 8 and 9, a single storage frame 30 comprises three basic elements—a movable frame member 170, a removable tube rack 172, and a plurality of storage tubes 64. Individual storage tubes 64 are removably loaded into a tube rack 172. The tube rack 172 is then placed into the frame member 170. Tube racks 172 are easily removed and replaced within the frame member 170, whereby a tube rack full of IC packages may be replaced without causing substantial delay in the operation of the unloader/sorter apparatus 20. The frame member 170 is arranged to step forward sequentially as storage tubes 64 are filled, so as to fill the individual storage tubes 64 one at a time.

More particularly, each tube rack 172 includes means for supporting a plurality of storage tubes 64, for example, twenty storage tubes 64, in an inclined position at spaced intervals along the length of the rack 172. The tube rack, 172 may comprise, for example, an aluminum frame having individual support members (not shown) for engaging the storage tubes 64. There preferably exists at least two tube racks 172 for each frame member 170, whereby a tube rack 172 loaded with empty storage tubes 64 may be available for replacement within the corresponding frame member 170.

The frame member 170 comprises a skeletal frame transportably attached to a frame track 174. The frame member 170 includes means for imparting motion to the frame member 170 along the track 174 and means, hereinafter described, for indicating to the control unit the position of the frame member 170. The skeletal steel frame defines a channel 176 at the base thereof, sized closely to the width of the tube rack 172, for receiving therewithin the tube rack 172. At the upper end of the frame member, a single rib member 178 extends horizontally along one side thereof. The absence of such a member 178 along the opposing upper side of the frame member 170 facilitates rapid insertion and removal of the tube rack 172. The frame member 170 further includes at least one cross support piece 180 for engaging the tube rack 172 and retaining it against the rib member 178.

The tube rack 172 seats within the forwardmost portion of the frame member 170, the rearward portion of the frame member 170 forming a part of the means for imparting motion to the frame member 170. The motion means may include the frame track 174, a plurality of carriage cars 182 for slidably engaging the track 174, a pneumatic cylinder 184, and a dual rack and pinion apparatus 186 for translating motion from the cylinder 184 to the frame member 170.

The frame track 174 comprises an inverted T-bar spanning between the front and rear lower horizontal members 38a,c of the frame 22. At least two carriage cars 182 adjoin the base channel 176 of the frame member and engage the track 174, one such carriage car 182 being positioned at the rearward end of the frame member 170. Each carriage car 182 comprises a carriage housing 186 and upper and lower rollers 188, 190. The carriage housing 186 surrounds the track 174 and provides structural support for the rollers 188, 190. Dual upper rollers 188a,b are rotatably supported on fixed, inwardly extending axles, so as to ride on opposing shoulders 192a,b of the track 174 and provide substantial support for the storage frame 30. The single lower roller 190 is rotatably supported on an axle just beneath the track 174, so as cooperatively to provide a low friction engagement with the track 174.

The pneumatic cylinder 184 is strapped to a cylinder support member 194. The cylinder support member 194 is connected between a cross support beam 196 (FIG. 1), extending between and offset slightly below the front and rear lower horizontal member 38a,c, and a first downward extension 198 from the right lower horizontal member 38b (FIG. 1). The pneumatic cylinder 184 includes a pair of ports 200a,b, to which the provision of pressurized fluid will cause extension and retraction of a cylinder shaft 202.

The outer end of the cylinder shaft 202 connects to a first gear rack 204, which forms a part of the dual rack and pinion apparatus 186. The dual rack and pinion apparatus 186 further includes a pinion gear 206 and a second gear rack 208. The first gear rack 204 meshes with the pinion gear 206, which is rotatably supported on a gear bar 210. The gear bar 210 is connected between the cross support beam 196 (FIG. 1) and a second downward extension 212 from the right lower horizontal member 38b (FIG. 1). A small rubber pulley 214 suspended from the gear bar 210 insures that the first gear rack continuously meshes with the pinion gear 206. The second gear rack 208 connects between the carriage housings 182 at the lower surfaces thereof and extends forwardly of the housings 182 to mesh with the pinion gear 206.

Thus, the fully extended cylinder shaft 202 places the storage frame 30 in its rearwardmost position, as shown in FIG. 8, with a first storage tube 64 being positioned for receipt of IC packages from the burn-in board table 26. As the cylinder shaft 202 is retracted, the storage frame 30 is moved gradually forward to position subsequent storage tubes 62 for receipt of IC packages.

The position indication means of the frame member 170 comprises a sensor means 216, similar to the sensor means 148, providing indications of the position of the burn-in board table 26. The sensor means 180, like the sensor means 148, relies on a light emitting diode 218 and a phototransistor 220 to locate and indicate the presence of a path for communication of light between the two elements 218, 220. Holes 222a,b through the frame member 170 and tube rack 172, between the storage tubes 64, define such a path, the centerline of which is marked by a line at 224. Each hole 222 defines the alignment for a single storage tube 64 within the tube rack 172. Further description may be had by reference to the description accompanying FIG. 10 in the subsection, supra, entitled "The Unloader Channels."

The Control Unit

Figure 11:
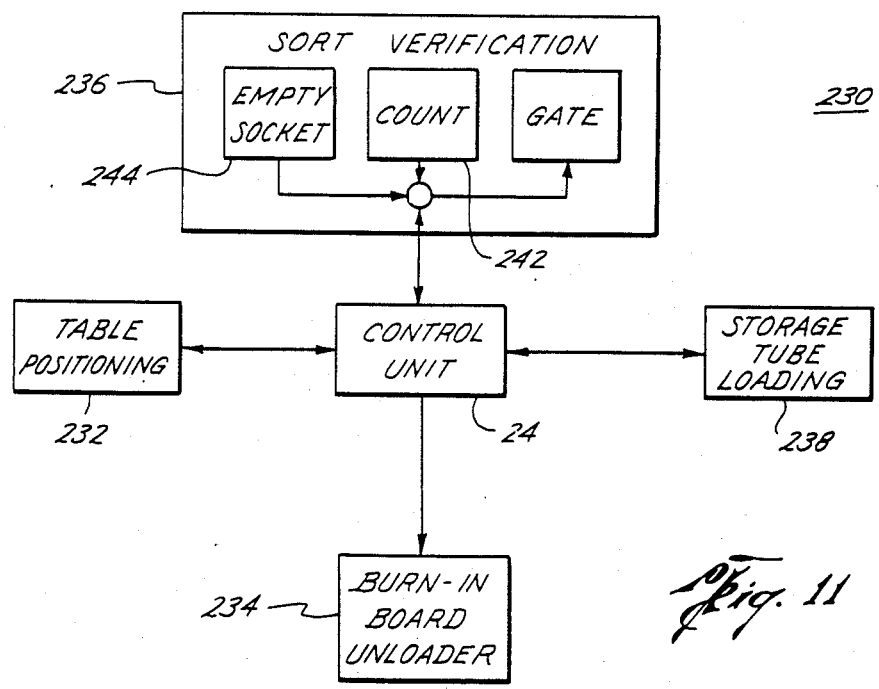
FIG. 11 is a block diagram of the control system for the unloader/sorter apparatus.

Referring now to FIG. 11, wherein a control system 230 for the unloader/sorter apparatus is depicted in block diagram form, the control unit 24 includes electronic hardware forming the heart of the control system 230. The control unit 24 preferably includes a microprocessor, such as a CPU-1 Z-80 microprocessor manufactured by Mostek, as well as such programmable read-only memory, random access memory, and input/output boards as are necessary to accomplish the control functions.

In addition, the control unit 24 preferably includes a mass data storage medium, such as a flexible disk drive unit, or an RS-232 serial interface to a suitable shared data source. For example, the control unit 24 hereof may be connected by serial interface directly to the control system of a burn-in/test apparatus, from which fully loaded burn-in boards are brought to the present unloader/sorter apparatus. Alternatively, both the unloader/sorter apparatus and the burn-in/test apparatus may be connected to a central processing control system. In the latter two cases, information regarding the burn-in board which is to be unloaded, including, most importantly, the performance grade of each IC package thereon, can be communicated to the present control unit 24 via the serial interface.

The external control functions associated with the control unit 24 fall into one of four categories—a table positioning subsystem 232, a burn-in board unloader subsystem 234, a sort verification subsystem 236, and a storage tube loading subsystem 238. The table positioning subsystem 232 includes input signals from a START button on a control panel (240 in FIG. 1), limit switches defining the limits of travel of the burn-in board table, and the table position sensor means (148 in FIG. 10) for locating the burn-in board table relative to the unloader channels. The foregoing input signals are processed within the control unit 24 to determine the nature of the output signal to be communicated to the motor (46 in FIG. 1) which drives the positioning screw (56 in FIG. 1), which moves the burn-in board table.

The burn-in board unloader subsystem 234 includes internal input data signalling that the burn-in board table is positioned properly beneath the unloader channels and identifying the particular IC packages to be unloaded from each unloader channel. The unloader subsystem 234 then delivers a plurality of output signals which effect the unloading of the designated IC packages. The output signals may, for example, energize solenoid valves, delivering pressurized gas to the pneumatic cylinders which push the IC packages from their respective sockets.

The sort verification subsystem 236 involves two independent verification systems. First, as the recently displaced IC packages slide down the grooves in the burn-in board table, photoelectric sensors in the sensor racks (68a,b in FIG. 8) count the number of IC packages passing by. If the number of IC packages counted equals the number of IC packages in that column designated for unloading, the count verification 242 is satisfied. Second, after the designated IC packages have been punched from a particular column of sockets, that column is moved beneath the photoelectric detectors (106 in FIG. 7) within the same unloader channel. The absence of an IC package in sockets from which IC packages were designated to be unloaded satisfies the empty socket verification 244. When both the count and empty socket verifications are satisfied, the sort verification subsystem generates output signals which open the gates (72 in FIG. 1) and permit loading of the IC packages into storage tube. The output signals may, for example, energize solenoid valves, which in turn direct pressurized air to the pneumatic cylinders controlling the state of the gate.

The final subsystem is the storage tube loading subsystem 238, the primary function of which is to maintain sufficient storage tube capacity in position for receipt of IC packages from the burn-in board table. This is accomplished by maintaining a count of the IC packages delivered to a particular storage tube, by knowing the capacity of a storage tube, given the size of IC package being unloaded, and by moving the storage frame when necessary to position empty storage tubes for receipt of IC packages. Input data regarding the position of the storage frames is received from the plurality of sensor means (216 in FIG. 9) monitoring storage frame position. Output signals from the storage tube loading subsystem control movement of the storage frames along the storage frame track (174 in FIG. 8). These output signals may, for example, energize solenoids which in turn deliver pressurized air to pneumatic cylinders (184 in FIG. 8).

Thus, the aforedescribed subsystems cooperate simultaneously to control operation of the unloader/sorter apparatus. While various other detailed operations are carried out by the control system 230, and particularly by the microprocessor within the control unit 24, the foregoing description presents an overview of the major control operations involved.

Operation of the Unloader/Sorter Apparatus

Referring briefly to FIGS. 1 and 2, the unloader/sorter apparatus 20 is depicted at it might appear immediately following attachment of the burn-in board 32 to the burn-in board table 26. Prior to beginning operation, the operator verifies that the storage frames 30 each have tube racks with empty storage tubes therein. To begin operation, the operator depresses a START button on the control panel 240 and operation begins with the burn-in board table 26 moving to the right, as viewed by facing the apparatus 20 as shown by the arrow at 40.

Figure 3:
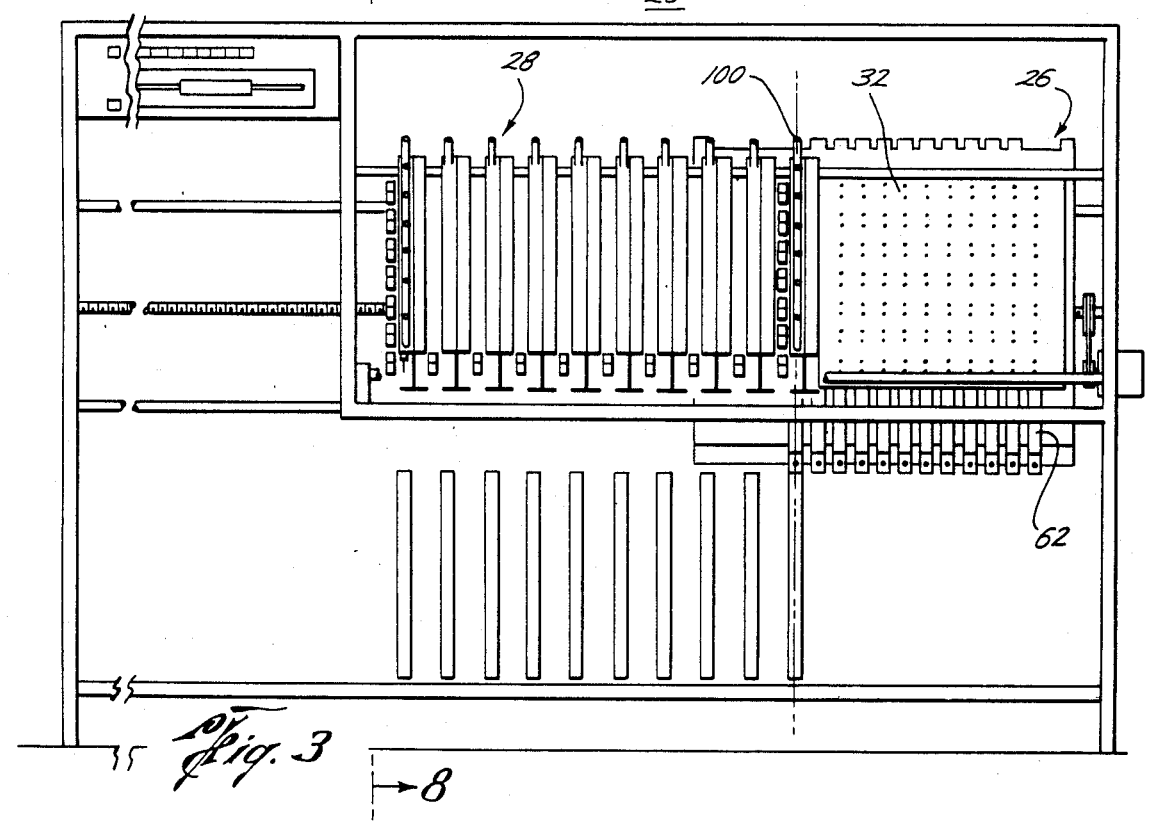
FIG. 3 depicts the apparatus of FIG. 2 in front elevation with the burn-in board table in position to begin the unloading and sorting process.

Referring now to FIG. 3, the burn-board table 26 continues moving to the right, sliding beneath the unloader channels 28 until the leftmost column of sockets on the burn-in board 32 is aligned directly beneath the unloader units 100 within the rightmost unloader channel 28. There are ten unloader channels 28 depicted in FIG. 3. Each unloader channel is associated with a particular performance grade of IC package. Consider, for example, IC packages having a performance grade designated as "Grade 5." Grade 5 IC packages may be "sorted" from all other IC packages by having the fifth and only the fifth unloader channel 28 push out IC packages of that grade. Thus, the unloader units 100 within the rightmost unloader channel 28 are energized selectively so as to push out only those IC packages of the particular performance grade assigned to that unloader channel 28.

The IC packages displaced by the first unloader channel 28 drop into the grooves 62 in the burn-in board table and slide past the sensor racks 68a,b (FIG. 8) which count the IC packages and verify that the number intended to be unloaded was infeed unloaded. Simultaneously therewith, the burn-in board table 26 is stepped to the left by approximately the width of one column of sockets on the burn-in board, to align the leftmost column of sockets with the column of photoelectric detectors 106 within the rightmost unloader channel, as shown in FIG. 4. Each unloader channel 28 covers the width of two columns of sockets on the burn-in board 26—one column being beneath the unloader units 100 and the other column being beneath the photoelectric detectors 106.

Referring now to FIG. 4, the photoelectric detectors 106, which are included with each unloader channel 28, can now perform the empty socket verification process on the leftmost column of sockets. If both the count and empty socket verifications are satisfied, the corresponding gate 72 is released and the IC packages are allowed to drop into a storage tube within the rightmost storage frame 30.

At the same time that the empty socket verification process is being performed on the first (leftmost) column of sockets, IC packages are unloaded from the second (from the left) column of sockets, which is aligned beneath the unloader units 100 of the rightmost unloader channel 28. On completion thereof, the burn-in board table steps to the left by the width of a column of sockets on the burn-in board 32 and the process continues. Each time the table 26 is stepped to the left by approximately the width of one column of sockets, alternate columns of sockets are aligned with the unloader units 100. Assume, for example, that there are seven columns of sockets on the burn-in board 32 and ten unloader channels 28 on the unloader/sorter apparatus 20. Assume, also, that the table 26 has moved to position all of the burn-in board 32 beneath the unloader channels 28. At some point in time, the first, third, fifth, and seventh columns of sockets will be positioned beneath the unloader units 100 of adjacent unloader channels 28. At the same time, the second, fourth, and sixth columns of sockets will be positioned beneath the photoelectric detectors 106 of adjacent unloader channels 28.

The unloader units 100 push designated IC packages from the first, third, fifth, and seventh columns of sockets substantially simultaneously. It may be desirable, however, to perform the unloading operation one column at a time, in rapid succession, to limit the load placed on the pneumatic fluid supply system. At the same time that the unloading occurs with respect to the aforenamed columns, the empty socket verification process is conducted on the second, fourth, and sixth columns. Then, the table 26 is stepped to the left by the width of one column of sockets so as to align the second, fourth, and sixth columns with the unloader units 100 and the first, third, fifth, and seventh columns with the photoelectric detectors 106.

Referring now to FIG. 5, the apparatus 20 is depicted with the unloading/sorting process nearing completion. All IC packages have been removed from portions of the burn-in board 32 located to the left of the unloader channel portion of the apparatus 20. As the burn-in board table 26 continues to move to the left, the apparatus 20 will gradually unload all IC packages from the burn-in board 32. The unloaded and sorted IC packages are accumulated by grades in storage tubes within the storage frames 30. As necessary, the storage frames 30 are advanced so as to collect the IC packages in unfilled tubes. The process continues until the entire burn-in board 26 has been exposed to all unloader channels. The final unloader channel may be arranged to displace all IC packages not previously unloaded. After the burn-in board has passed beneath all unloader channels 28, it resumes the position shown in FIGS. 1 and 2 for replacement with another burn-in board 32 requiring unloading.

IMPROVED EMBODIMENT OF THE UNLOADER/SORTER APPARATUS

System Overview

Figure 12:
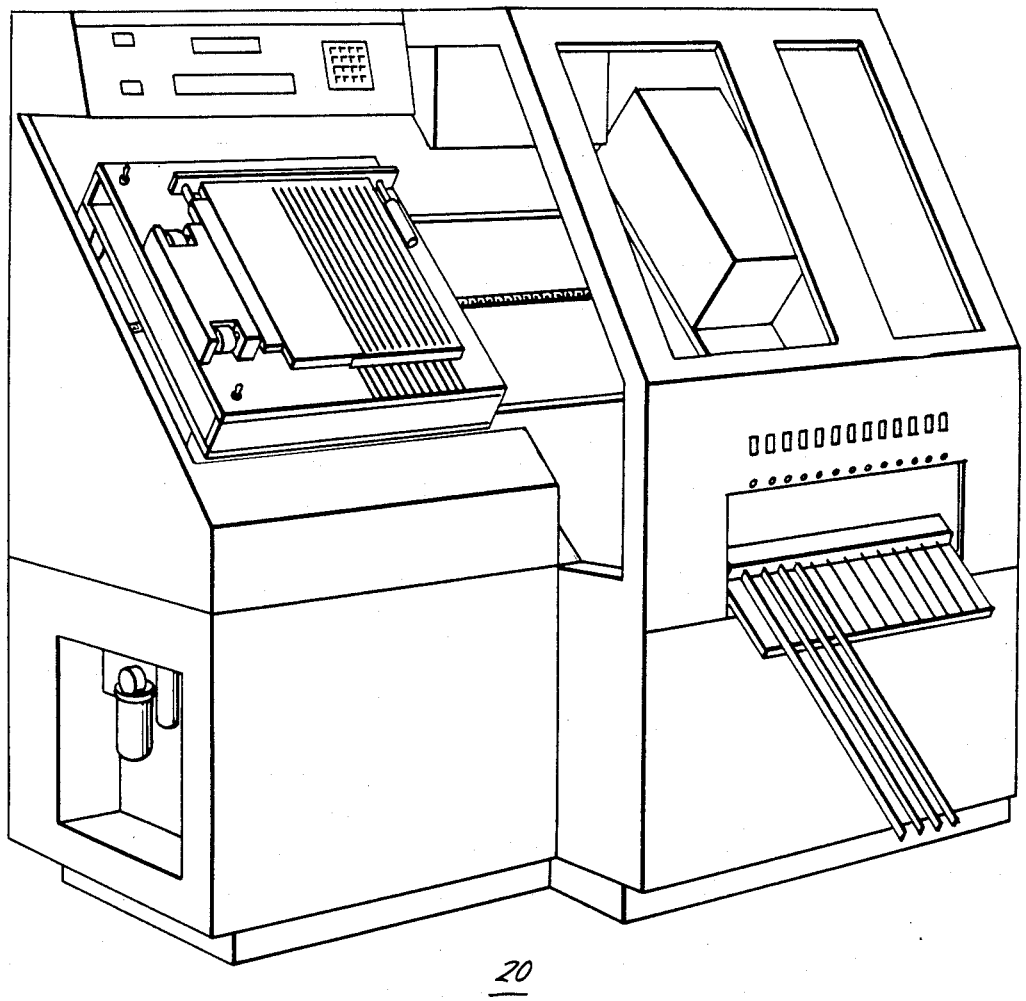
FIG. 12 shows a perspective view of an improved embodiment of the unloader/sorter apparatus.
Figure 13:
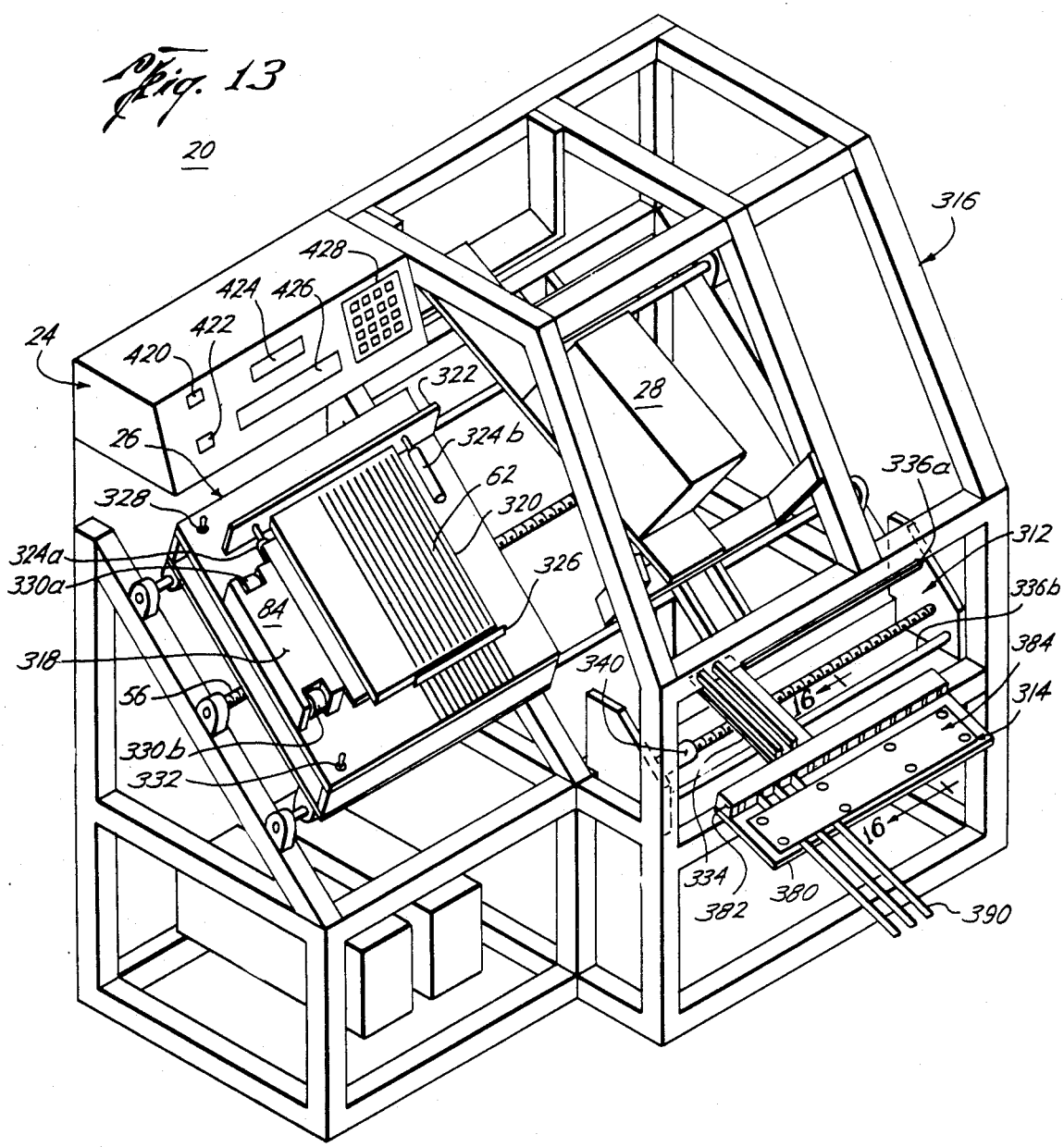
FIG. 13 depicts a perspective view of the apparatus shown in FIG. 12 with portions thereof removed to reveal internal details of the apparatus.

In supplement to the foregoing disclosure, detailed herein are certain improvements to the unloader/sorter apparatus realized during actual reduction to practice. The general principles of the invention, as already described, remain unchanged. Where possible, portions of the invention previously described will be identified by the reference characters previously used. Referring now to FIG. 12, the improved embodiment of the unloader/sorter apparatus 20 is shown in its finished state. Referring also to FIG. 13, the apparatus 20 is depicted with portions thereof removed to reveal internal details of the apparatus 20.

An improved unloader/sorter apparatus 20 constructed in accordance with the principles of the invention comprises a control unit 24, a burn-in board table 26, one or more unloader channels 28, a shuttle plate assembly 312, and a tube rack assembly 314, all of which are supported on and within a welded metal frame 316. The major functional differences between the improved embodiment of the apparatus and that previously described are threefold. First, because of the substantial expense involved in constructing the apparatus and controls for a plurality of unloader channels 28, it is preferred to use a single unloader channel 28 to unload all IC packages from a single burn-in board. Second, as a consequence of using a single unloader channel 28, the present invention includes a shuttle plate assembly 312 for transferring IC packages from the burn-in board table 26 to the appropriate storage tube on the tube rack assembly 314. Finally, the storage frames (30 in FIG. 1) have been replaced with the simplified tube rack assembly 314. In all other major respects, the apparatus 20 functions substantially as previously described.

Burn-In Board Table

Referring still to FIG. 13, the burn-in board table 26 of the improved embodiment differs in certain respects from the previous description thereof. The table 26 preferably comprises a base plate 318 and a detachable guide plate 320 which is secured to the base plate 318 and which covers a generally rectangular opening (not shown) in the base plate 318. The opening exposes a substantial portion of the underside of the guide plate 320. The base plate 318 can accommodate any of several different guide plates 320, each sized for a different type of burn-in board. The guide plate 320, as previously described for the table 26, includes a plurality of grooves 62 by which IC packages are gravity-fed from the burn-in board (not shown) mounted on the guide plate 320 to the shuttle plate assembly 312.

The burn-in board table 26 further comprises a lock bar 322 and a pair of pneumatic cylinders 324a,b. The burn-in board is secured to the table 26 by placing the lower edge thereof beneath a lip 326 at the lower end of the guide plate 320 and lowering the burn-in board against the guide plate 320 with the columns of sockets on the burn-in board aligned with the grooves 62 in the guide plate 320. Thereafter, a manual switch 328 is actuated to cause the pneumatic cylinders 324a,b to retract their shafts, thereby engaging the lock bar 322 against the upper edge of the burn-in board.

The slot connector 84 is improved in the present apparatus 20 to include pneumatic cylinders 330a,b which may be actuated by a manual switch 332 to cause the slot connector 84 to engage the edge connector on the burn-in board (not shown). The motor (46 in FIG. 1) for rotating the positioning screw 56, which in turn moves the table 26, is preferably a direct drive motor, rather than a motor which is coupled to the positions screw 56 by means of a belt. A direct drive motor provides greater power and positioning accuracy.

As may be seen by reference to FIG. 13, the table 26 does not include sensor racks (68a,b in FIG. 1), mouthpiece (66 in FIG. 1), or gates (72 in FIG. 1). Substantial equivalents of the sensor racks and the gates have been incorporated into the shuttle plate assembly 312. The mouthpieces are unnecessary in light of the alignment of the storage tubes 390 on the tube rack assembly 314, as hereafter described.

Unloader Channels

The single unloader channel 28 of the present embodiment is constructed substantially in accordance with the unloader channel 28 depicted in FIGS. 6 and 7 and described supra. As noted, however, it is preferred that the single unloader channel 28 be used to unload all IC packages from the burn-in board. The procedure by which the single unloader channel 28 is so used is set forth infra in the subsection entitled "Operating Procedure." More than one unloader channel 28 may be desirable where the apparatus 20 is to accommodate burn-in boards of different dimensions.

Referring now to FIGS. 6 and 7, the unloader channel 28 depicted in FIG. 13 differs in certain respects from the channel 28 depicted in FIGS. 6 and 7 and described supra. First, the unloader channel 28 of the present embodiment includes a pair of reed switches (not shown) for each unloader unit 100. The reed switches are mounted adjacent to the upper and lower portions of the pneumatic cylinder 104 for each unit 100, whereby motion of the cylinder shaft 114 may be verified. Second, the light source 80 used in cooperation with the photoelectric detector 106 for verifying the presence or absence of an IC package in a particular socket is preferably a column of light-emitting diodes (LEDs) (not shown), one for each socket in the aligned column. The LEDs, rather than being affixed to the lower surface of the table 26 as described for the bulb 80 depicted in FIGS. 6 and 7, preferably are attached to the frame (316 in FIG. 13) in alignment with each of the photoelectric detectors 106 within the unloader channel 28.

Finally, the apparatus 20 further includes a plurality of air jets (not shown), each comprising essentially a tube for communicating air from a source of pressurized air, or another suitable gas, and a nozzle at the end of the tube for directing the air. The air jet nozzles are positioned adjacent to the LED light sources, fixed in position beneath the plane of travel of the table 26 in alignment with one of the bores 122a or 122b in the lower horizontal extension 124 of the unloader unit support member 102. Each air jet directs a stream of pressurized air upwardly through boreholes in the base of the grooves 62 in the guide plate (320 in FIG. 13). The air jet may be continuous so as to prevent IC packages from becoming jammed within the grooves 62, or may be intermittent according to detection of a jammed IC package so as to dislodge jammed IC packages. In all other major respects, the unloader channel 28 depicted in FIG. 13 is substantially identical to the unloader channel 28 shown in FIGS. 6 and 7 and described in the specification supra.

Shuttle Plate Assembly

Figure 14:
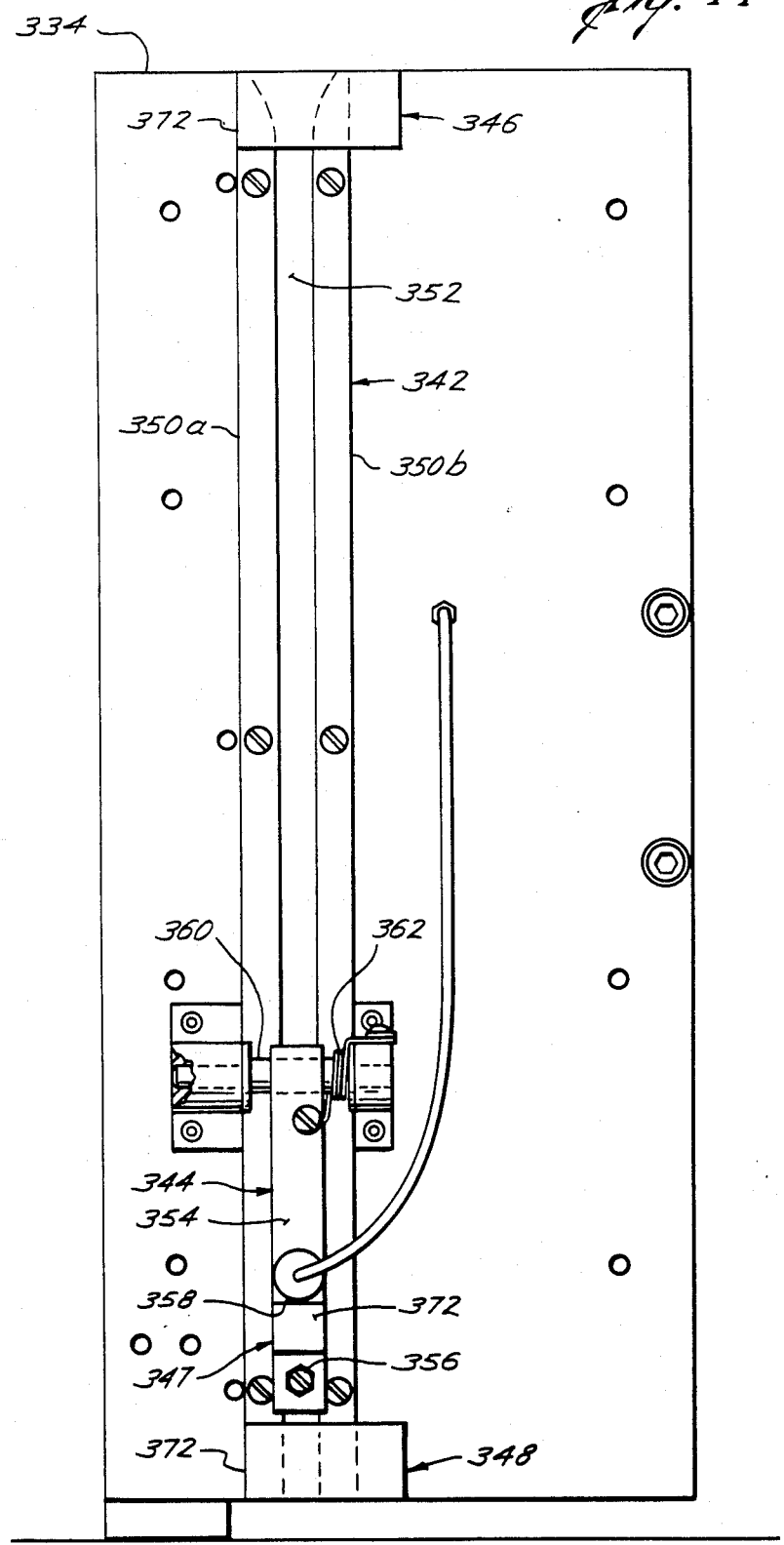
FIG. 14 shows a shuttle plate assembly of the apparatus in FIG. 13 in top elevation.
Figure 15:
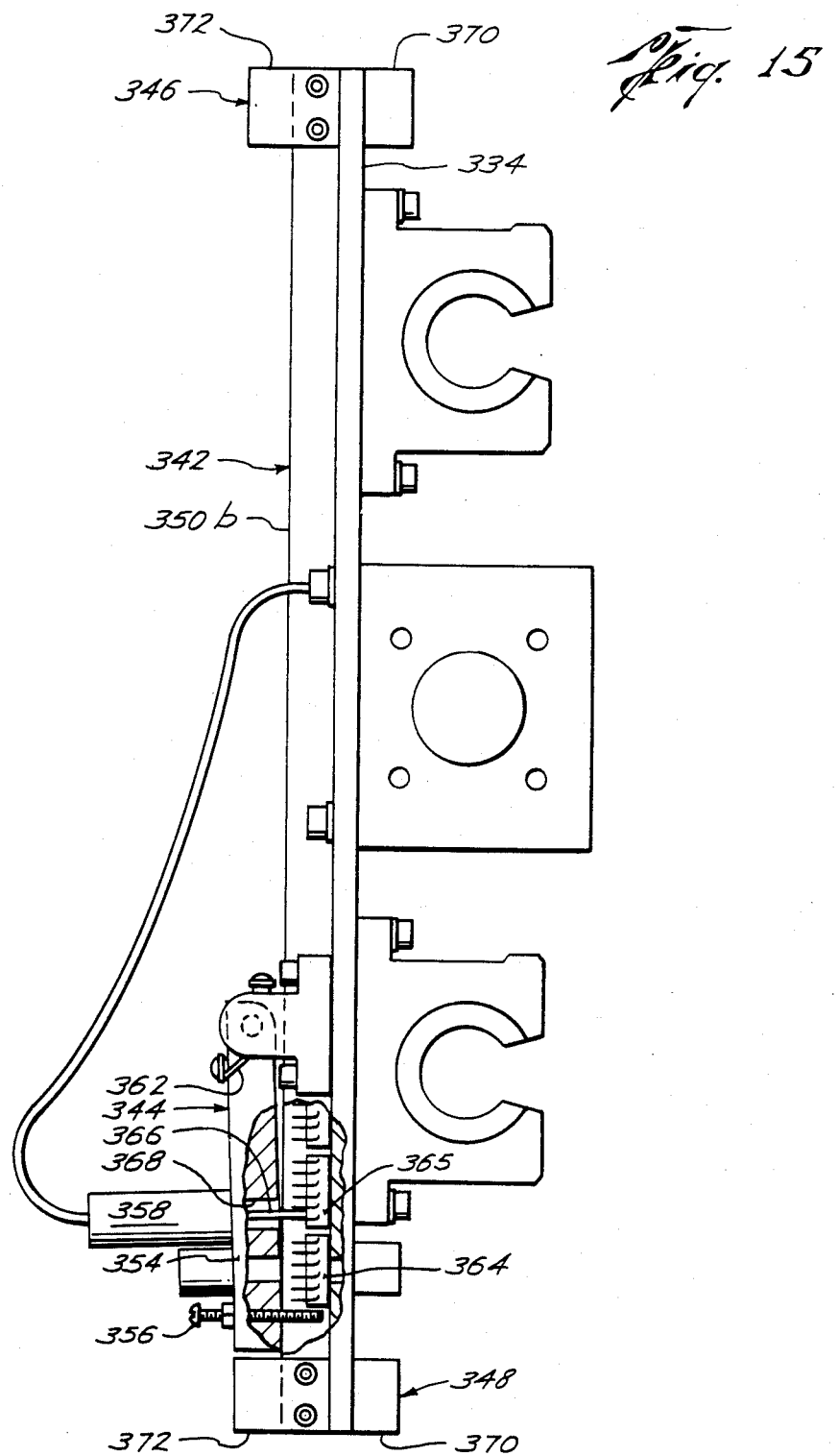
FIG. 15 shows the shuttle plate depicted in FIG. 14 in side elevation with portions thereof cut away.

Referring now to FIGS. 13, 14, and 15, the shuttle plate assembly 312 comprises a shuttle plate slidably disposed on a pair of shuttle bars 336a,b, with a shuttle positioning screw 338 coupled directly to a shuttle motor 340 for imparting motion to the shuttle plate 334 along the bars 336a,b. The shuttle plate 334 includes a shuttle track 342, a gating mechanism 344, an upper optical sensor 346, a mediate optical sensor 347, and a lower optical sensor 348.

The shuttle track 342 comprises a pair of parallel wall members 350a,b secured to the shuttle plate 334 and defining therebetween a shuttle groove 352 for receiving IC packages from the burn-in board table. IC packages enter at the end of the track 352 adjacent to the upper optical sensor 346, slide down the track 352, and accumulate beneath the gating mechanism 344 at the lower end of the track 352.

Referring still in FIGS. 13, 14, and 15, the gating mechanism 344 comprises a pivotable arm 354, a gate screw 356, and a pneumatic cylinder 358. The arm 354 is pivotably secured on a shaft 360 above the track 352. A biasing means 362, such as a spring member, biases the pivotable arm 354 downwardly against the upwardly facing surfaces of the wall members 350a,b. The width of the arm 354 exceeds the spacing between the wall members 350a,b, so that the arm 354 will not extend within the track 352. The gate screw 356 is threadedly engaged within a bore in the free end of the arm 354 so as to protrude into the track 352 and block the passage of IC packages 364 along the track 352. The pneumatic cylinder 358 is affixed to the upper surface of the arm 354, intermediate of the gate screw 356 and the pivotable end of the arm 354, at a position whereby the shaft 366 of the cylinder 358 may extend through a bore 368 in the arm 354 and engage the body portion of an IC package 365 immediately adjacent the lowermost IC package 364. Accordingly, when the shaft 366 of the cylinder 358 is extended, it engages the second IC package 365 and thereafter pivots the lower end of the arm 354 away from the track 352, moving the gate screw 356 out of the track 352 and releasing the lower IC package 364 to move off of the shuttle plate assembly 312. The second IC package 365 is held in position by the extended shaft 366 of the cylinder 358. As the cylinder shaft is retracted, the arm 354 pivots back into position against the upper surface of the wall members 350a, b, and the second IC package 365 is released to move into position as the lowermost IC package 364 against the gate screw 356. In this manner, IC packages 364, 365 are released one at a time from the shuttle plate assembly 312.

The upper, mediate, and lower optical sensors 346, 347, 348 each comprise a light source 370, such as an LED, and a photoelectric detector 372. The upper optical sensor 346, in cooperation with the control unit 24, verifies the passage of an IC package from the guide plate 320 onto the shuttle plate 334. Likewise, the lower optical sensor 348 cooperates with the control unit 24 to vertify the passage of an IC package from the shuttle plate 334 onto the tube rack assembly 314. Signals from the lower optical sensor 348 also are used by the control unit to maintain a count of the IC packages of each particular performance grade so as to determine when a particular storage tube 390 on the tube rack assembly 314 is full. The mediate optical sensor 347 enables the control unit 24 to verify the absence of any IC packages in the shuttle groove 352 when the control unit has determined, via the upper and lower optical sensors, 346, 348, that all IC packages deposited onto the shuttle plate 334 have been passed on to the tube rack assembly 314.

Tube Rack Assembly

Figure 16:
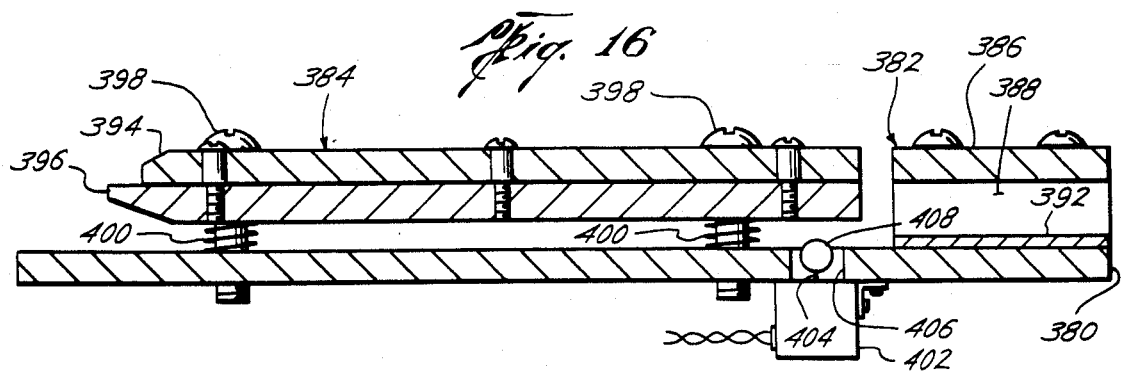
FIG. 16 depicts a tube rack assembly in a cross section taken along a line 16—16 in FIG. 3.

Referring now to FIGS. 13 and 16, the tube rack assembly 314 comprises a support plate 380, an upper guide member 382, and a tube support rack 384. The support plate 380 comprises a generally rectangular plate secured to the frame 36 in substantially the same plane as the guide plate 320 on the burn-in table 26. The upper guide member 382 comprises a generally rectangular bar member 386 having a plurality of generally rectangular slots 388, one for each tube on the tube rack assembly 314, machined therein. The upper guide member 382 is secured at each end thereof by means such as screws to the support plate 380 with the slots 388 opposing the support plate 380 so as to form enclosed tunnels which communicate IC packages from the shuttle plate assembly 312 to IC package storage tubes 390 supported within the tube rack assembly 314. A spacer member 392 positioned between the upper guide member 382 and the support plate 380 has a thickness approximately equal to the wall thickness of the storage tubes 390, whereby IC packages slide unimpeded from the slots 388 of the guide member 382 into the storage tubes 390.

The tube support rack 384, which comprises apparatus for securing storage tubes 390 into alignment with the slots 388 in the upper guide member 382, comprises a compression plate 394 and a plurality of tube guide bars 396. The compression plate 394 comprises a generally rectangular sheet of transparent material, such as plexiglass, mounted in spaced relationship and generally parallel to the support plate 380 on a plurality of support bolts 398. Biasing means 400, such as a spring positioned on the support bolts 398 between the compression plate 394 and the support plate 380, biases the compression plate 394 away from the support plate 380. The tube guide bars 396, one for each storage tube 390 supported by the tube rack assembly 314, are secured to the underside of the compression plate 394 along the centerline of the slots 388 through the upper guide member 382. Storage tubes 390 are inserted between the compression plate 394 and the support plate 380 with the guide bar 396 received within the longitudinal depression in each storage tube 390.

Referring still to FIG. 16, the tube rack assembly further comprises a plurality of microswitches 402, one for each slot 388 in the upper guide bar 396, having actuator stems 404 protruding within a bore 406 in the upper end of the support plate 380 adjacent to the upper guide member 382. The actuator stem 404 includes means such as a wheel 408 rotatably secured to the stem 404 for translating the force imparted to a storage tube on insertion thereof into the tube rack assembly 314 by ninety degrees to cause actuation of the microswitch 402. The microswitch 402 provides an indication for the control unit 24 as to the presence or absence of a storage tube 390 within a particular position on the tube rack assembly 314.

Operating Procedure

Referring first to FIG. 13, operation of the improved embodiment of the unloader/sorter apparatus 20 is commenced by securing a burn-in board to the guide plate 320 on the burn-in board table 26. As described supra, the burn-in board is placed face down on the guide plate 320 and the manual switch 328 is actuated to cause the lock bar 322 to move downwardly into engagement with the upper edge of the burn-in board. Next, the operator actuates the second manual switch 332, causing the slot connector 84 to engage the edge connector on the burn-in board.

The control unit includes a start button 420, a stop button 422, a flexible disk drive 424, an alphanumeric display 426, and a key pad 428 for entering data into the control unit 24. When the operator presses the start button 420, the control unit 24 inquires via the alphanumeric display 426 as to the lot number for the IC packages to be unloaded. The operator then enters via the key pad 428 the appropriate lot number. Using the lot number entered by the operator and a serial number which the control unit 24 reads directly from the burn-in board through the slot connector 84, the control unit 24 searches through the data stored in its memory files to locate a map which indicates the location of the IC packages on the burn-in board and the performance grade previously determined for each such package. The memory files may be stored on flexible disks and, hence, accessed through the flexible disk drive 424, or may be stored in the memory files of a central computer with which the control unit 24 communicates via a serial interface. If the control unit 24 is not successful in locating a map for the particular IC packages to be unloaded, the operator is presented with an appropriate error message through the alphanumeric display 426. In the succeeding description herein, each time a verification check is not successful or each time an error is encountered, the operator is presented with an appropriate error message via the alphanumeric display 426. Further reference herein wil not be made to such error messages.

If the control unit 24 locates the appropriate sort map, the apparatus 20 is ready to begin operation. When the operator presses a second start button on the key pad 428, the burn-in board table 26 commences motion to the right (as viewed facing the front of the apparatus 20). Referring now to FIGS. 6, 7, and 13, the apparatus 20 peforms an optical inspection of each socket on the burn-in board as the table 26 passes beneath the unloader channel 28. The photoelectric detectors 106, in combination with the column of LEDs therebeneath (not shown), scan the burn-in board to verify that the sort map stored in the memory file of the control unit 24 is accurate, at least with respect to the presence or absence of IC packages in the sockets. The table 24 continues motion to the right until it reaches its end of travel near the right end of the frame 316, whereupon it reverses motion and then stops when the leftmost column of sockets on the burn-in board is aligned beneath the unloader channel 28.

Referring still to FIGS. 6, 7, and 13, the unloader channel 28 commences operation on the first column of sockets on the burn-in board. Starting with a first performance grade of IC packages, the appropriate unloader units 100 are selectively energized one at a time beginning with the lowermost of the appropriate unloader units 100. Thus, a first unloader unit 100 is pneumatically actuated, forcing an IC package of the first performance grade out of its socket and into the corresponding groove 62 of the guide plate 320. After the displaced IC package slides from the guide plate 320 onto the shuttle plate assembly 312, as verified by the upper optical sensor (346 in FIGS. 14 and 15) thereon, the next unloader unit 100 is actuated to displace the next IC package of the first performance grade from the first column.

The unloading sequence involves three separate verifications for each IC package unloaded. First, the control unit 24 verifies that an electrical signal was directed to a solenoid-actuated valve (not shown) which controls the pneumatic cylinder 104 for the particular unloader unit 100. Second, the reed switches (not shown) adjacent to each pneumatic cylinder 104 verify motion of the cylinder shaft 114. Third, the upper optical sensor (346 in FIGS. 14 and 15) verifies passage of the IC package from the guide plate 320 onto the shuttle plate assembly 312. All three verifications must be successfully completed before the next IC package is unloaded.

Referring now to FIGS. 13, 14, 15, and 16, after all IC packages of a particular performance grade have been unloaded from the first column of the burn-in board and collected on the shuttle plate assembly 312, the control unit 24 actuates the drive motor 340 for the shuttle plate assembly 312 to reposition the shuttle plate 334 into alignment with a storage tube 390 predesignated with a performance grade corresponding to that of the IC packages on the shuttle plate 334. The performance grade and the IC package capacity for each storage tube 390 is assigned by way of input switches to the control unit 24. When the shuttle groove 352 on the shuttle plate assembly is aligned with the appropriate slot 388 on the tube rack assembly 314, the gating mechanism 344 is actuated to release IC packages one at a time from the shuttle plate assembly 312 onto the tube rack assemby 314. Passage of each IC package between the two assemblies 312, 314 is verified by the control unit 24 through the lower optical sensor 348. When the control unit 24 determines via the count of IC packages generated by the lower optical sensor 348 that all IC packages on the shuttle plate assembly 312 have been delivered to the tuube rack assembly 314, the control unit 24 verifies through use of the mediate optical sensor 347 that no IC packages remain in the shuttle groove 352. The shuttle plate assemby 312 is then repositioned into alignment with the unloader units (100 in FIGS. 6 and 7) in the unloader channel 28. The unloading procedure continues by repetition of the foregoing until all IC packages from the first column of sockets on the burn-in board have been unloaded.

Referring again to FIGS. 6, 7, and 13, when the IC packages in the first column of sockets on the burn-in board have been unloaded, the table 26 steps to the left to align the second column of sockets with the unloader channel 28. In so doing, the first column of sockets is thereby aligned with the column of photoelectric detectors 106 and the corresponding column of LEDs therebeneath. Using the photoelectric detectors 106, the control unit 24 verifies that all IC packages have indeed been unloaded from the first column of sockets on the burn-in board. The unloading procedure continues as detailed above with respect to the second and succeeding columns until the entire burn-in board is free of IC packages. The control unit 24 then compares the accumulated totals of unloaded IC packages for each performance grade with totals derived from the original sort map for the particular burn-in board to provide yet another verification of system accuracy. Thereafter, the table 26 moves back to its original position at the left end of the apparatus 20, to permit the operator to remove the empty burn-in board.

Referring now to FIGS. 13 and 16, during the unloading process, the operator monitors the status of storage tubes 390 on the tube rack assembly 314 so as to replace with empty storage tubes 390 those tubes 390 which are full of IC packages. The panel of the apparatus 20 immediately above the tube rack assembly 314 includes a plurality of LED indicators, one for each storage tube 390 in the tube rack assembly 314. When a storage tube 390 is inserted into the tube rack assembly 314, the microswitch 402 corresponding to the particular tube 390 provides an indication to the control unit 24 that a storage tube 390 is present. The control unit 24 in turn causes the corresponding LED indicator to turn on. By maintaining a count of the number of IC packages delivered to each storage tube 390 in the tube rack assembly 314 and by comparing the counted numbers to the preassigned IC package capacity for the storage tubes, the control unit 24 determines when a particular storage tube 390 is full and so indicates to the operator by causing the corresponding LED indicator to cycle off and on. When the operator replaces the full storage tube with an empty storage tube, the control unit resets its counter and causes the LED indicator to cease flashing. In this manner, the operator maintains IC package storage capacity on the tube rack assembly 314. It is anticipated that more than one storage tube 390 may be assigned a particular performance grade.

Conclusion

The unloader/sorter apparatus described herein is a powerful and efficient tool by which IC packages may be simultaneously unloaded from sockets on a burn-in board and sorted into any number of predetermined performance grades. Use of the unloader/sorter apparatus with a burn-in/test apparatus eliminates altogether the need for a separate tester/sorter, which, by its nature is complex and expensive. Elimination of the tester/sorter apparatus from the quality control process will also accelerate the overall process and, hence, render it more cost efficient.

While a preferred embodiment of the invention has been shown and described, modifications thereof can be made by one skilled in the art without departing from the spirit of the invention.

What is claimed is:

1. A burn-in board, comprising:
   a printed circuit board;
   a plurality of sockets mounted on said printed circuit board; and
   a plurality of passageways, at least one said passageway for each said socket, each of said passageways extending through said printed circuit board and a respective one at said sockets whereby IC packages are displaced from said sockets by insertion of tools through said passageways.

2. In a printed circuit board with an IC package socket including means for removably receiving an IC package on an upper side and means of the socket attaching said socket to the printed ciruit board on a lower side of the socket, the improvement comprising at least one passageway extending from the side of the printed circuit board opposite that to which the socket is attached to the upper side of the socket for receiving a tool inserted through the passageway to displace the IC package from said socket.

3. Apparatus according to claim 2 wherein said socket and said printed circuit board comprise a burn-in board.

* * * * *